United States Patent
He et al.

(10) Patent No.: US 7,183,798 B1
(45) Date of Patent: Feb. 27, 2007

(54) SYNCHRONOUS MEMORY

(75) Inventors: Xiaojie He, Austin, TX (US); Sajitha Wijesuriya, Macungie, PA (US); Claudia Stanley, Austin, TX (US); John Schadt, Bethlehem, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 119 days.

(21) Appl. No.: 11/041,319

(22) Filed: Jan. 24, 2005

(51) Int. Cl.
*H03K 19/173* (2006.01)
(52) U.S. Cl. .................. 326/38; 326/93; 365/230.05
(58) Field of Classification Search ............ 326/38–41; 365/189.02, 189.03, 230.05
See application file for complete search history.

(56) References Cited

U.S. PATENT DOCUMENTS

| | | | |
|---|---|---|---|
| 4,942,593 A | * | 7/1990 | Whiteside et al. .......... 375/372 |
| 6,091,645 A | * | 7/2000 | Iadanza ................. 365/189.02 |
| 6,185,119 B1 | * | 2/2001 | Haeberli et al. .............. 365/45 |
| 6,411,124 B2 | * | 6/2002 | Lee et al. ..................... 326/41 |
| 6,671,842 B1 | * | 12/2003 | Phan et al. ................. 714/733 |
| 6,987,401 B1 | * | 1/2006 | Langhammer et al. ........ 326/40 |

* cited by examiner

*Primary Examiner*—Don Le
(74) *Attorney, Agent, or Firm*—MacPherson Kwok Chen & Heid LLP; Greg J. Michelson

(57) ABSTRACT

Systems and methods are disclosed herein to provide improved memory techniques for logic blocks within a programmable logic device. For example, in accordance with an embodiment of the present invention, a programmable logic device includes a first and a second logic slice adapted to receive a first and a second clock signal. The first and second logic slices may be combined to form wider and deeper memory and single port or synchronous dual port memory.

20 Claims, 9 Drawing Sheets

SYNCHRONOUS MEMORY

TECHNICAL FIELD

The present invention relates generally to electrical circuits and, more particularly, to systems and methods for implementing memory.

BACKGROUND

Programmable logic devices, such as field programmable gate arrays, typically include repetitive blocks of logic that interface with each other through a hierarchical interconnect architecture. The blocks of logic generally include one or more look-up tables (LUTs) that are organized into physically and functionally identical units, with each unit referred to as a slice or a logic slice.

Each slice often can implement different functional modes, such as for example a logic mode, an arithmetic ripple mode, a random access memory (RAM) mode, and/or a read only memory (ROM) mode. The memory cells utilized for the RAM mode and the ROM mode are typically the same memory cells that are utilized to implement the LUT in the logic mode or the arithmetic ripple mode.

For example, FIG. 1 shows a block diagram 100 illustrating two conventional slices 102, which for example may be configured as RAM (i.e., traditional slice RAM). Each slice 102 (i.e., slice 102(1) or 102(2)) includes a write port control circuit 104, two LUTs 106 (labeled LUT0 and LUT1 or LUT2 and LUT3), and two registers 108 (labeled Register0 and Register1 or Register 2 and Register3). Slice 102(1) receives a clock (CLK0) signal 110 and slice 102(2) receives a clock (CLK1) signal 112.

A drawback of a typical slice is that a write to the memory cells may be synchronous, but a read from the memory cells is limited to be either asynchronous or synchronous to the same clock as the write clock. For example, each slice typically has only one clock and one clock enable, which makes a dual port RAM mode cumbersome with the read on the two ports either asynchronous or synchronous to the same clock as the write clock. As a result, there is a need for improved memory techniques.

SUMMARY

In accordance with one embodiment of the present invention, a programmable logic device includes a first logic slice adapted to receive a first clock signal, wherein the first logic slice includes a first write port clock multiplexer; a first write port control circuit coupled to the first write port clock multiplexer; a first and a second lookup table coupled to the first write port control circuit; a first and a second register couplable to the first and second lookup table; and a first read port clock multiplexer coupled to at least one of the first and second registers. The programmable logic device further includes a second logic slice adapted to receive a second clock signal, wherein the second logic slice includes a second write port clock multiplexer; a second write port control circuit coupled to the second write port clock multiplexer; a third and a fourth lookup table coupled to the second write port control circuit; a third and a fourth register couplable to the third and fourth lookup table; and a second read port clock multiplexer coupled to at least one of the third and fourth registers; wherein the first logic slice is also adapted to receive the second clock signal and the second logic slice is also adapted to receive the first clock signal.

In accordance with another embodiment of the present invention, a programmable logic device includes a plurality of first logic slices adapted to receive a first and a second clock signal, wherein the first logic slice includes a plurality of first lookup tables adapted to provide logic or memory functions; a plurality of first registers coupled to corresponding ones of the first lookup tables; and means for selectively providing the first and second clock signals to at least one of the first registers. The programmable logic device further includes a plurality of second logic slices adapted to receive the first and second clock signals, wherein the second logic slice includes a plurality of second lookup tables adapted to provide logic or memory functions; a plurality of second registers coupled to corresponding ones of the second lookup tables; and means for selectively providing the first and second clock signals to at least one of the second registers.

In accordance with another embodiment of the present invention, a method of providing synchronous memory within a programmable logic device includes providing a first and a second clock signal for a first and a second logic slice; utilizing the first clock signal as a write clock signal for ports A and B provided by the first logic slice; and utilizing the second clock signal as a read clock signal for at least one of ports A and B provided by the second logic slice.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
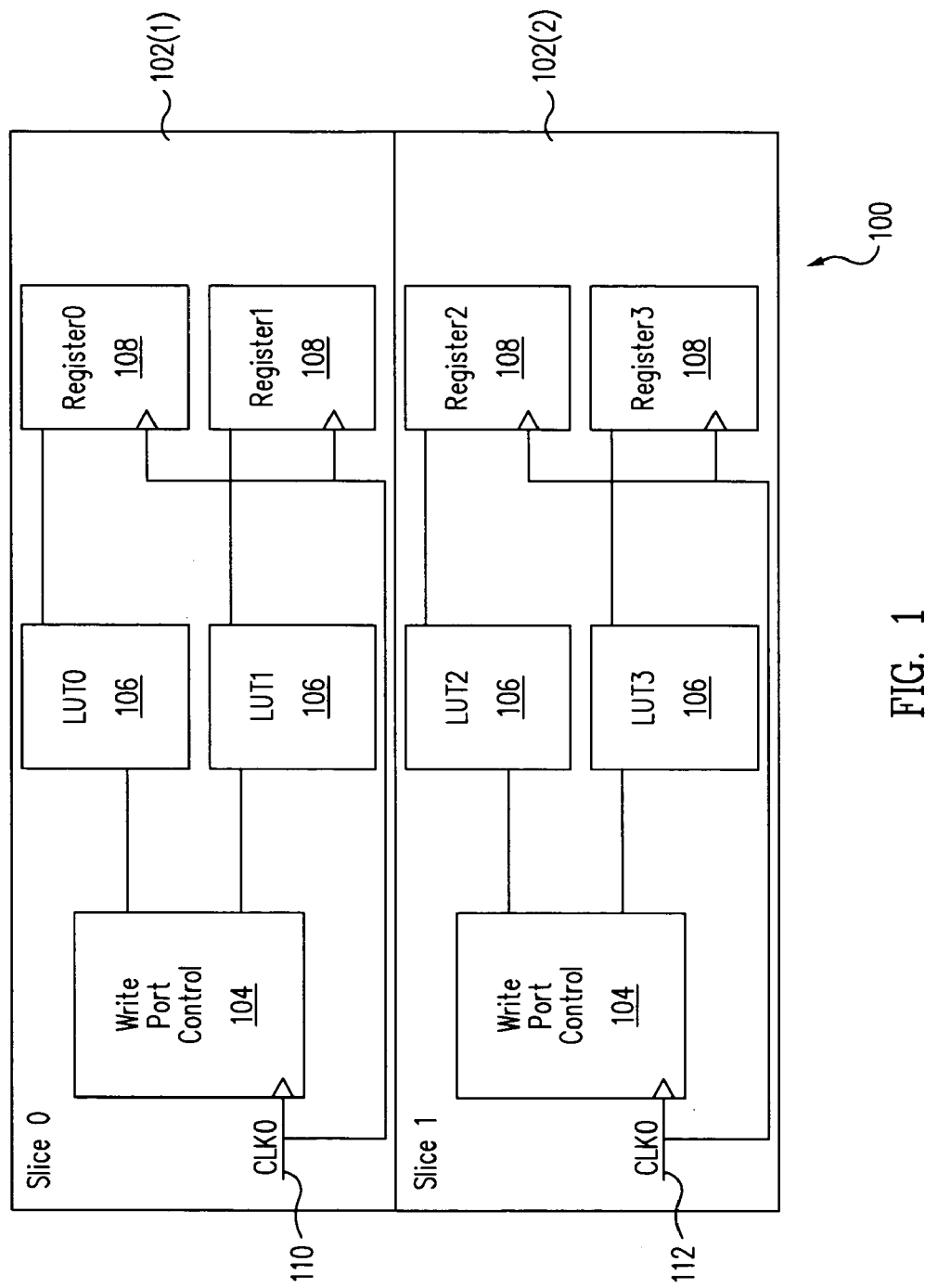
FIG. 1 shows a block diagram illustrating two conventional slices.
Figure 2:
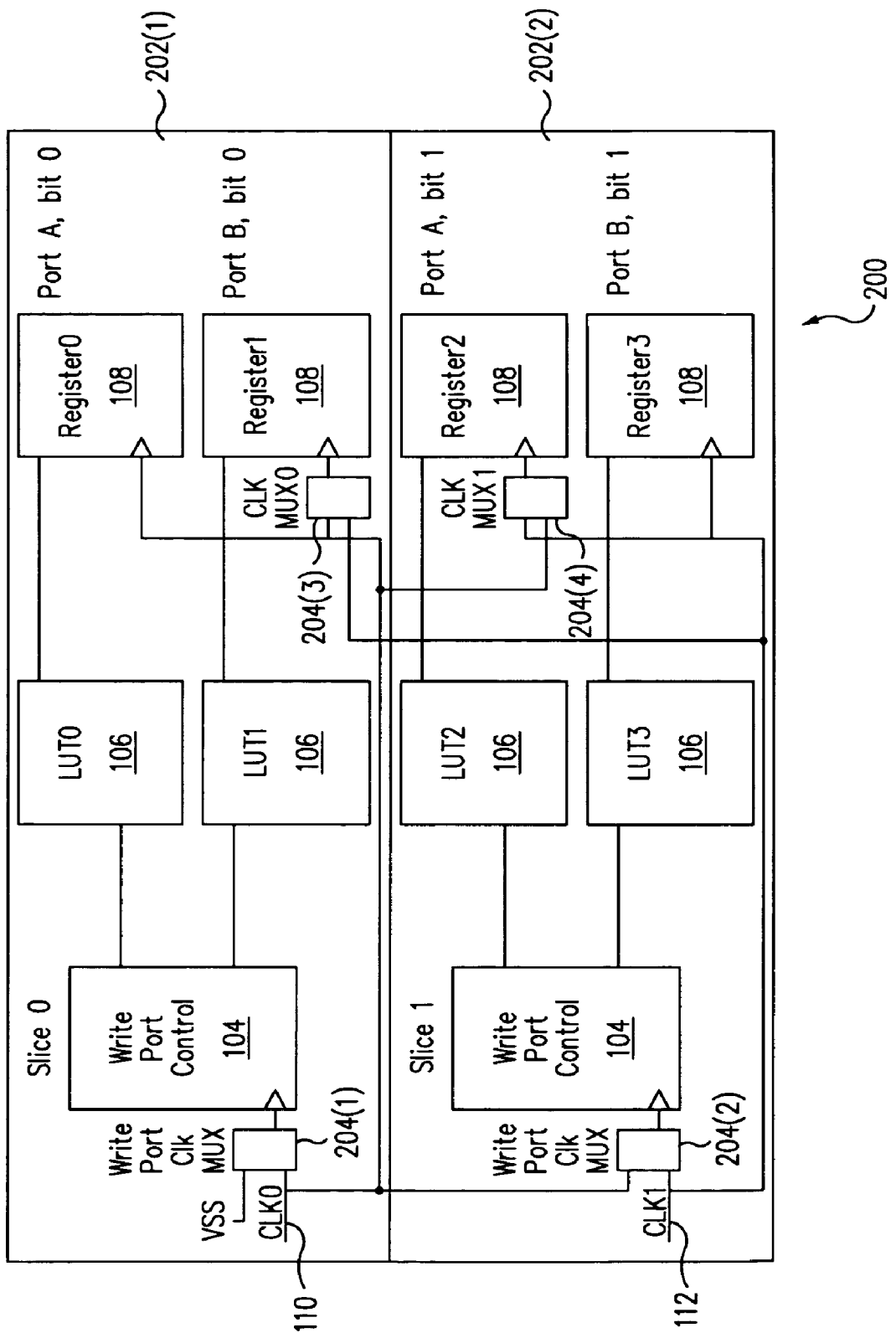
FIG. 2 shows a block diagram illustrating two slices in accordance with an embodiment of the present invention.

FIG. 2 shows a block diagram 200 illustrating two slices 202 in accordance with an embodiment of the present invention. Slices 202(1) and 202(2) are similar to slices 102(1) and 102(2) of FIG. 1, but include multiplexers 204 (separately referenced as multiplexers 204(1), 204(2), 204(3), and 204(4)) and additional routing of clock signals 110 and 112.

Clock signal 110 from slice 202(1) (labeled slice 0) is provided to slice 202(2) (labeled slice 1), while clock signal 112 from slice 202(2) is provided to slice 202(1) as shown in FIG. 2. Multiplexers 204(1) and 204(2) function as write port clock multiplexers, with multiplexer 204(1) generally functioning to match or balance slice 202(1) with slice 202(2). Multiplexers 204(3) and 204(4) function as read port clock multiplexers. Consequently, slices 202(1) and 202(2) may be paired together to implement, for example, a fully synchronous dual port RAM (e.g., synchronous slice RAM), with the ability to write and read from two separate clock signals (i.e., clock signals 110 and 112).

For example, in accordance with an embodiment of the present invention, an exemplary implementation for dual port RAM mode may employ LUTs 106 (LUT0 and LUT1) of slice 202(1) as storage elements for bit zero for a Port A and a Port B, respectively, as indicated in FIG. 2. LUTs 106 (LUT2 and LUT3) of slice 202(2) would then be employed as storage elements for bit one for the Port A and the Port B, respectively.

In this example, clock signal 110 may be utilized as a write clock for both the Port A and the Port B and as a read clock for the Port A. Clock signal 112 may then be utilized as a read clock for the Port B. As an example, if each LUT 106 has sixteen memory cells, this exemplary implementation will effectively form a 16 by 2 synchronous read/write dual port RAM for the combined slices 202(1) and 202(2).

Slices 202(1) and 202(2) are no longer identical, for example in the dual port RAM mode exemplary implementation due to the steering of clock signals 110 and 112 and the locations of multiplexers 204(3) and 204(4). However, slices 202(1) and 202(2) now provide certain advantages, such as for example with the Port A and the Port B able to provide the synchronous read from two separate clocks (clock signals 110 and 112) for this mode.

Figure 3:
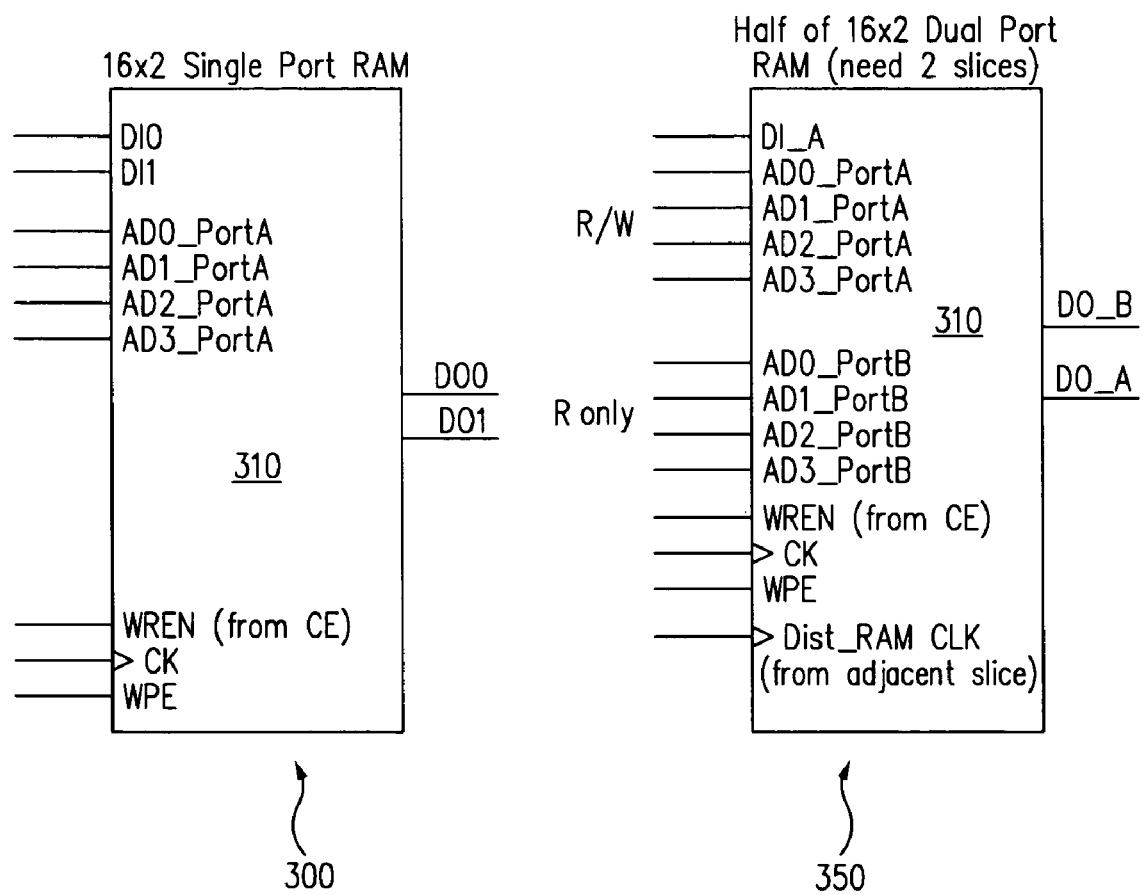
FIG. 3 shows a block diagram illustrating a slice as a single port and a dual port memory in accordance with an embodiment of the present invention.

FIG. 3 shows a block diagram illustrating an exemplary slice 310 configured as a single port RAM 300 and as a dual port RAM 350 in accordance with an embodiment of the present invention. In a distributed memory mode for the programmable logic device for this exemplary implementation, each LUT within slice 310 can function as sixteen bits of serial memory (i.e., 16 by 1 bits). The two LUTs in slice 310 can be configured as a single port 16 by 2 memory (e.g., RAM 300 with single Port A being read or write) or as half of a dual port 16 by 2 memory (e.g., RAM 350), as illustrated in FIG. 3.

The dual port memory (RAM 350) may be achieved, for example, by storing the same information in LUT1 and LUT0 (not shown) of slice 310 so that LUT0 functions as a read/write only memory and LUT1 functions as a read only memory (i.e., Port A is read or write while Port B is read only). Furthermore, by utilizing four slices 310, a 16 by 8 single port memory or a 16 by 4 dual port memory may be implemented. By adding additional LUT logic to perform multiplexing, deeper and narrower memories are possible (e.g., as illustrated in reference to FIGS. 5 and 6).

Figure 4A:
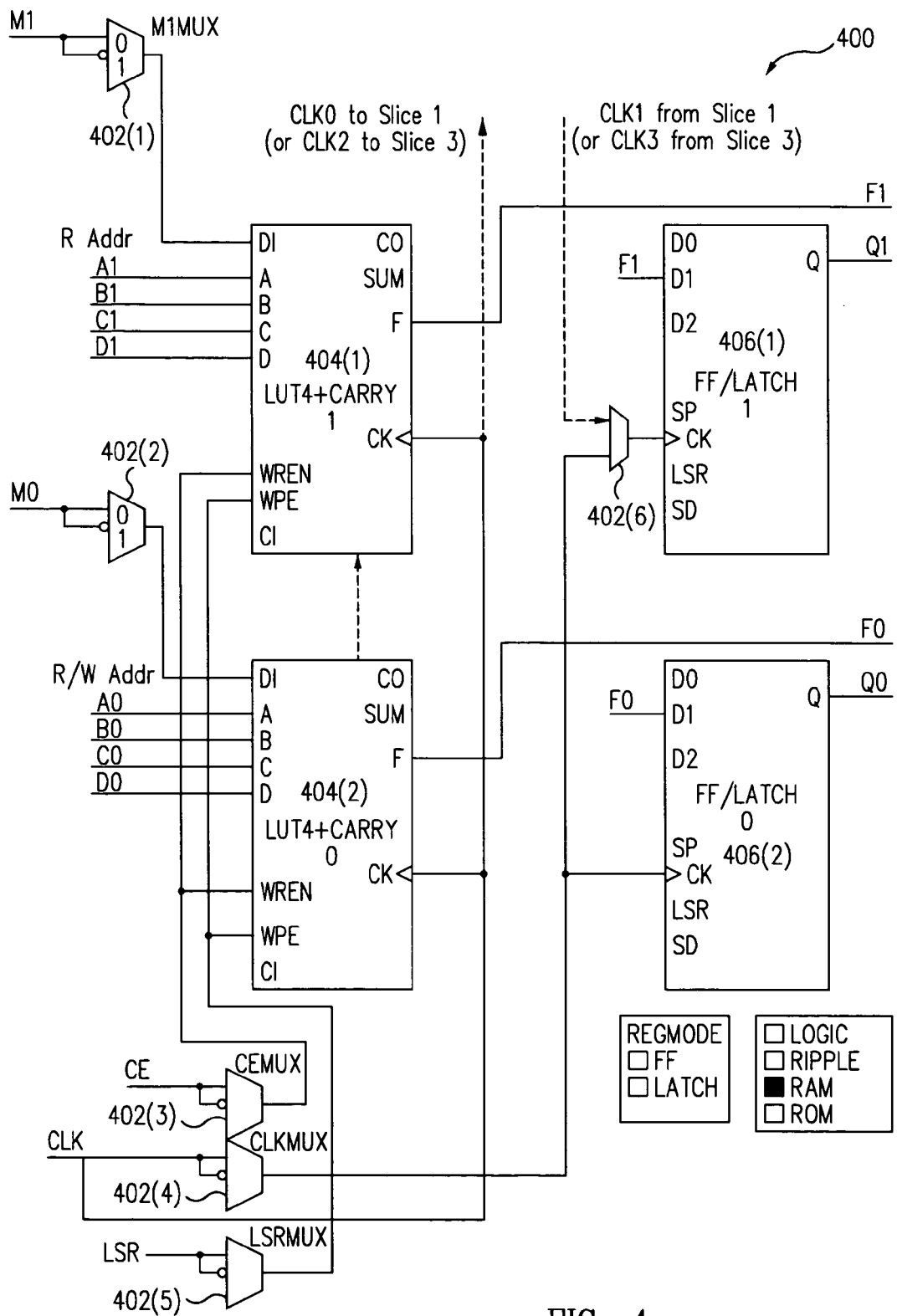
FIGS. 4a and 4b show block diagrams illustrating exemplary slices in accordance with an embodiment of the present invention.
Figure 4B:
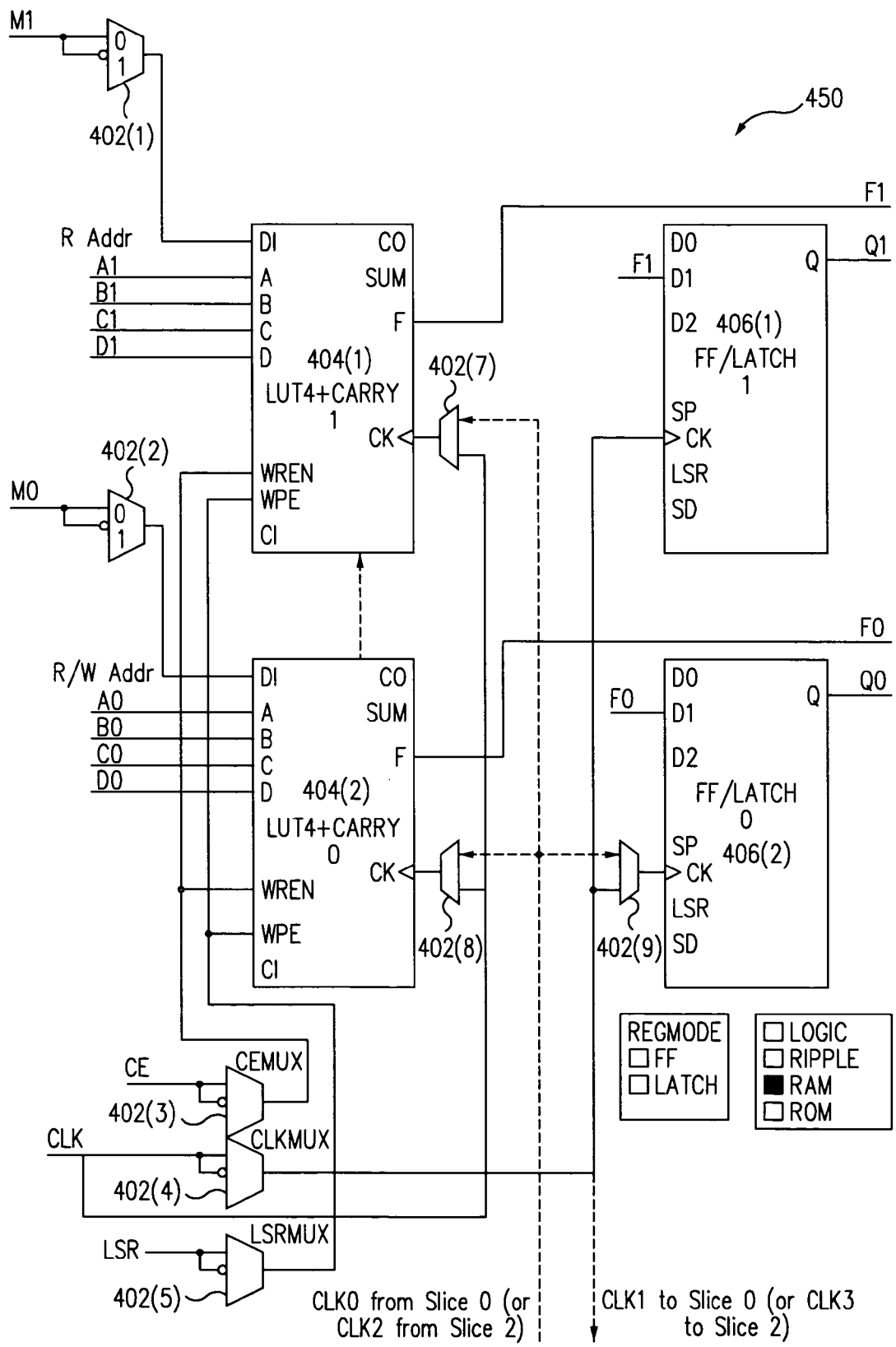

FIGS. 4a and 4b show block diagrams illustrating exemplary slices 400 and 450, respectively, for a memory mode in accordance with an embodiment of the present invention. Slice 400 is an exemplary implementation of a slice 0 in a distributed memory mode (e.g., a single port 16 by 2 memory or half of a dual port 16 by 2 memory). Slice 450 is an exemplary implementation of a slice 1 in a distributed memory mode (e.g., a single port 16 by 2 memory or half of a dual port 16 by 2 memory). For example, slices 400 and 450 may form an exemplary slice pair as described in reference to FIG. 2 for slices 202(1) and 202(2), respectively.

Slices 400 and 450 each generally include multiplexers 402, LUTs 404, and registers 406. As an example, in a single port 16 by 2 mode, write data is received through multiplexers 402(1) and 402(2), read data is provided from LUTs 404(1) and 404(2) via corresponding leads labeled F1 and F0. For synchronous reads that are registered, the read data may be provided from registers 406(1) and 406(2) via corresponding leads labeled Q1 and Q0.

Four bits of address may be provided to LUTs 404(1) and 404(2) to select among the sixteen bits available in this exemplary implementation. A clock enable (CE) signal and a local set/reset (LSR) signal may be employed to provide a write enable in RAM mode for corresponding slices 400 and 450 (e.g., a separate CE signal and LSR signal may be provided to each slice). In general, the write clock and the read clock for this example are the same in single port RAM mode.

As another example, in dual port 16 by 2 mode, a first clock signal is always used to write data into slices 400 and 450 and a second clock signal is used to read data from registers 406. For this example, in contrast to the single port 16 by 2 mode example, any clock signal may be utilized to register the output data. Furthermore, signals to multiplexers 402 (e.g., multiplexers 402(1), 402(2), and/or 402(3)) may be tied to ground or to a supply voltage as needed.

Figure 5A:
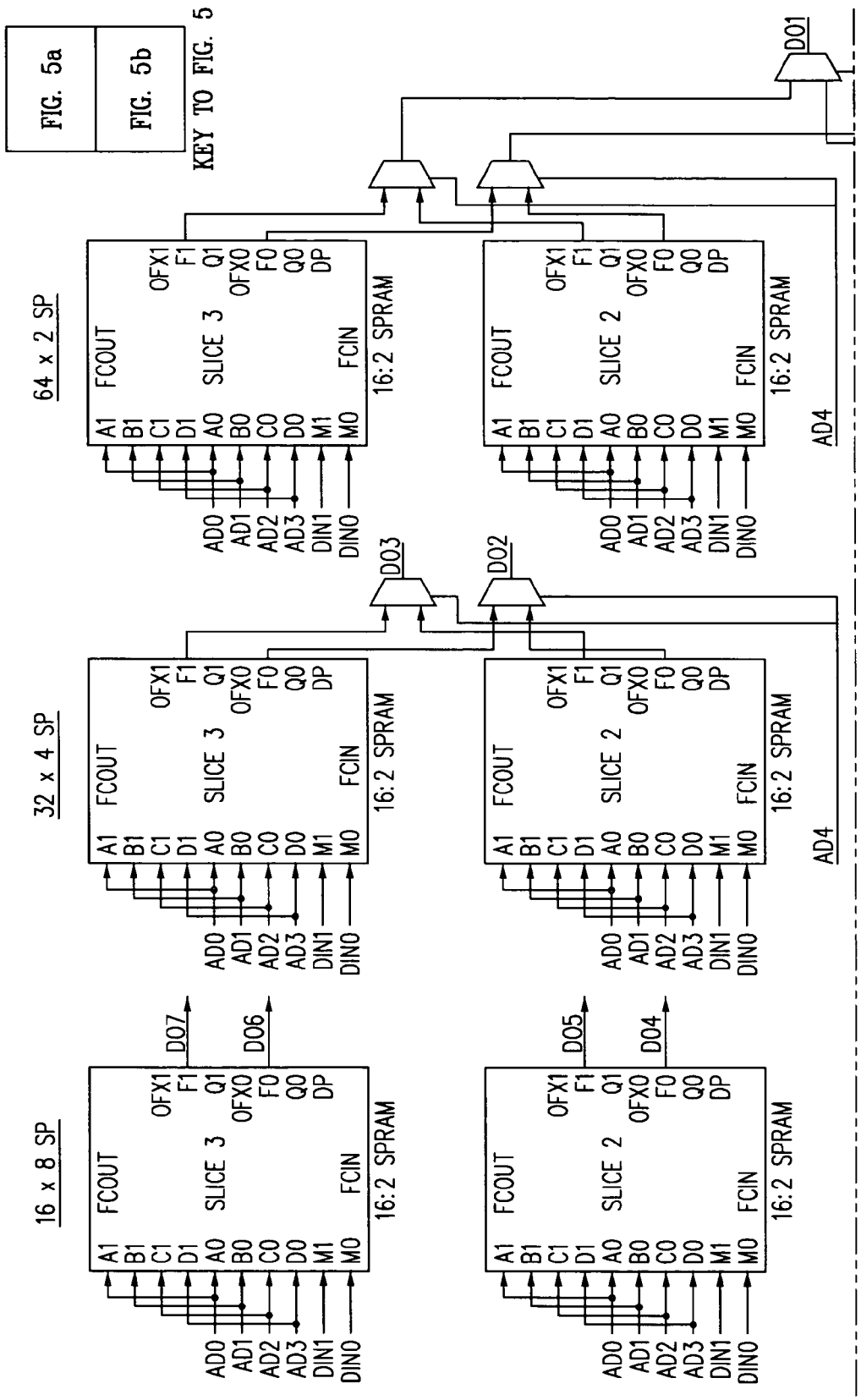
FIG. 5 shows a block diagram illustrating exemplary single port memory modes for a number of slices in accordance with an embodiment of the present invention.
Figure 5B:
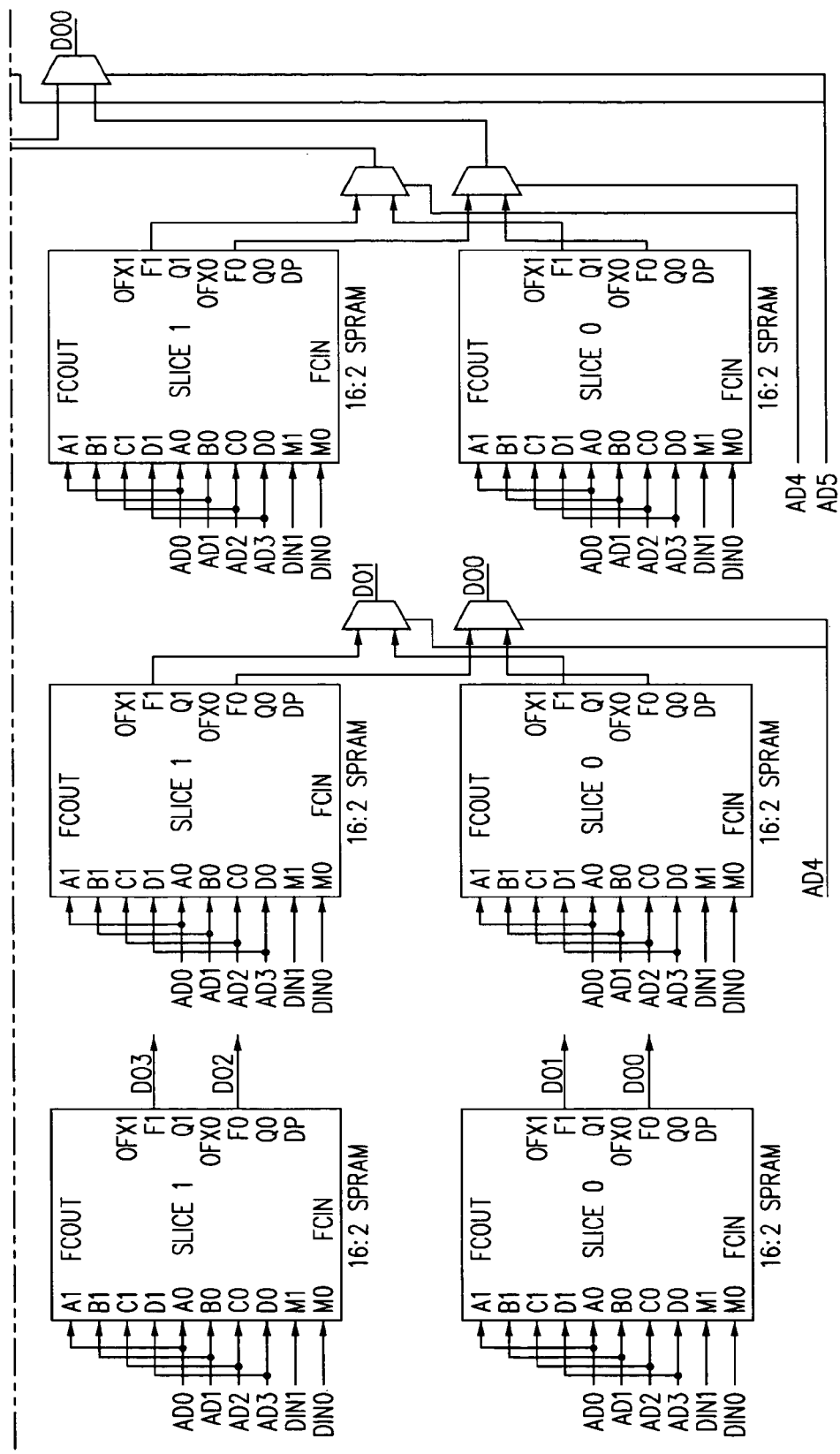
Figure 6A:
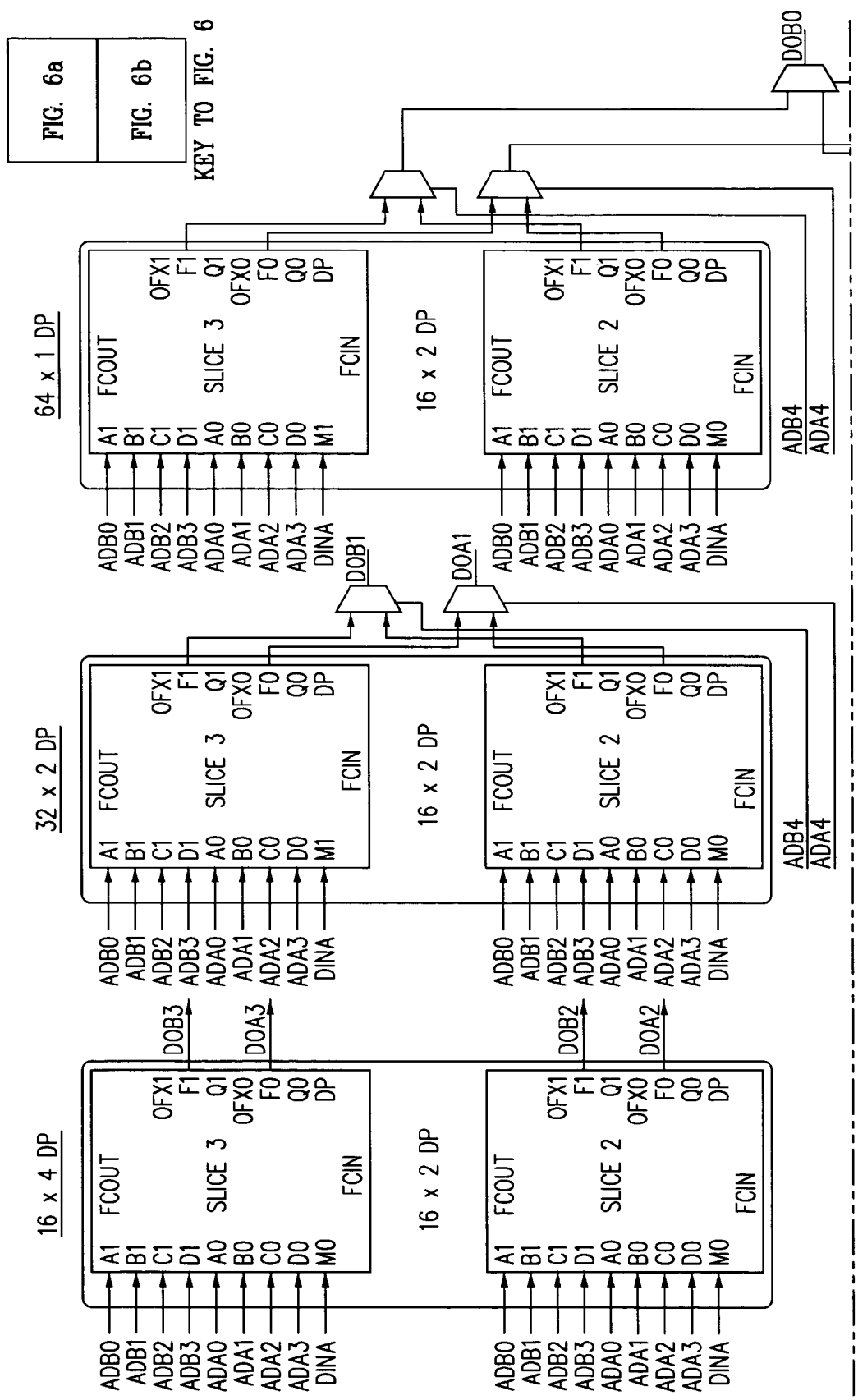
FIG. 6 shows a block diagram illustrating exemplary dual port memory modes for a number of slices in accordance with an embodiment of the present invention.
Figure 6B:
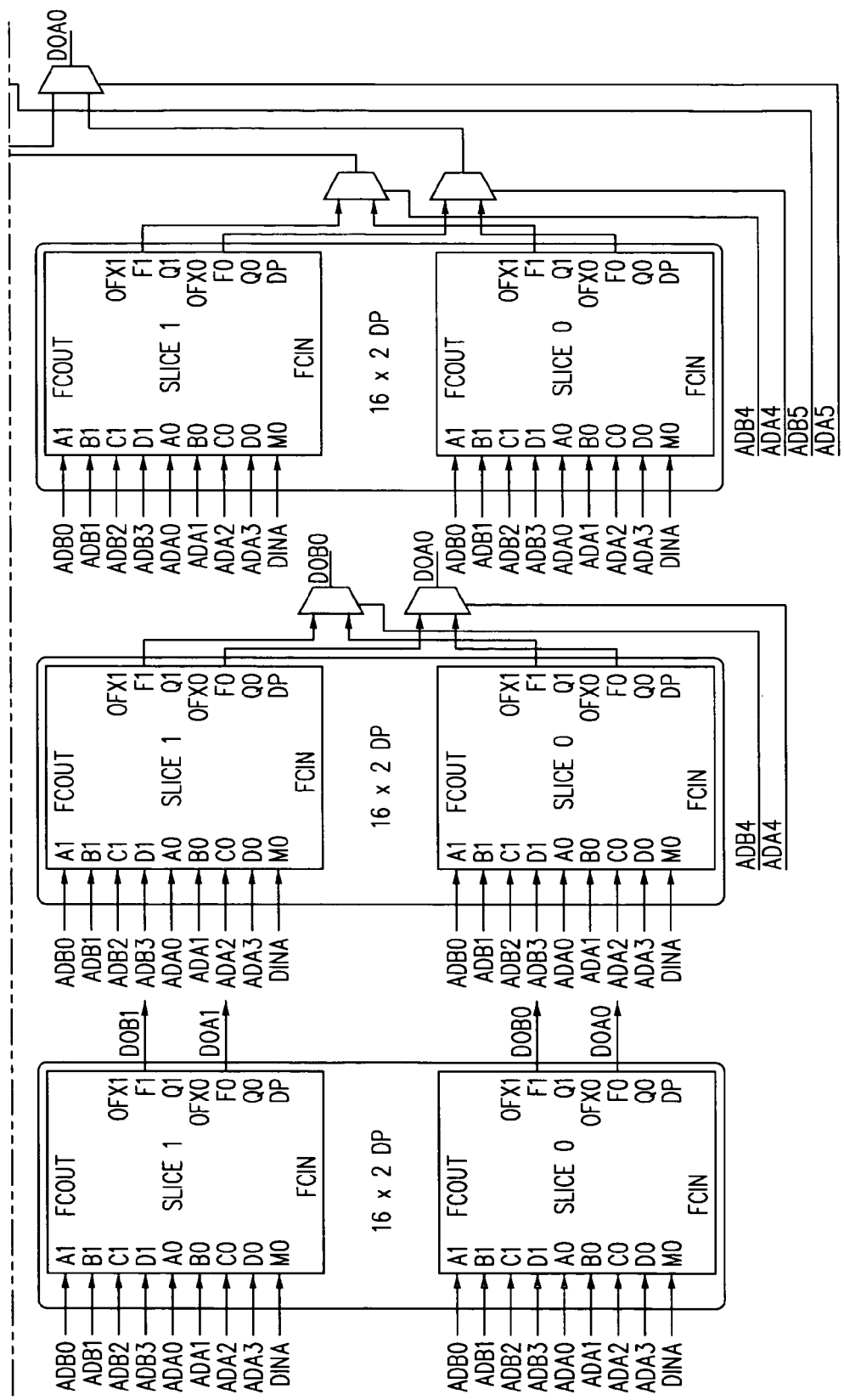

Larger single port memories may involve cascading slices, for example, with additional multiplexers employed to implement deeper memories (e.g., 32 by 4 or 64 by 2 single port memories). For example, FIG. 5 shows a block diagram illustrating exemplary single port memory modes for a number of slices in accordance with an embodiment of the present invention. Specifically, FIG. 5 illustrates a 16 by 8 single port, a 32 by 4 single port, and a 64 by 2 single port memory. FIG. 6 shows a block diagram illustrating exemplary dual port memory modes for a number of slices in accordance with an embodiment of the present invention. Specifically, FIG. 6 illustrates a 16 by 4 dual port memory and that, for this exemplary implementation, with additional multiplexing as shown, additional memory configurations are possible (e.g., 32 by 2 or a 64 by 1 dual port memory).

Systems and methods are disclosed herein to provide improved memory techniques. For example, in accordance with an embodiment of the present invention, synchronous and asynchronous memory techniques are disclosed for programmable logic devices. As a specific example, synchronous dual port RAM may be implemented by pairing programmable logic device slices as disclosed herein.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
    a first logic slice adapted to receive a first clock signal, wherein the first logic slice comprises:
    a first write port clock multiplexer;
    a first write port control circuit coupled to the first write port clock multiplexer;
    a first and a second lookup table coupled to the first write port control circuit;
    a first and a second register couplable to the first and second lookup table; and a first read port clock multiplexer coupled to at least one of the first and second registers;

a second logic slice adapted to receive a second clock signal, wherein the second logic slice comprises:
    a second write port clock multiplexer;
    a second write port control circuit coupled to the second write port clock multiplexer;
    a third and a fourth lookup table coupled to the second write port control circuit;
    a third and a fourth register couplable to the third and fourth lookup table; and
    a second read port clock multiplexer coupled to at least one of the third and fourth registers; and
wherein the first logic slice is also adapted to receive the second clock signal and the second logic slice is also adapted to receive the first clock signal.

2. The programmable logic device of claim 1, wherein the first and second logic slices are adapted to selectively function as a single port memory and as a synchronous dual port memory.

3. The programmable logic device of claim 1, wherein the first and second logic slices are adapted to provide a dual port memory having ports A and B, with the first clock signal providing a write clock signal for ports A and B and a read clock signal for port A, and the second clock signal providing a read clock signal for port B.

4. The programmable logic device of claim 3, wherein the first logic slice provides a bit zero for ports A and B, while the second logic slice provides a bit one for ports A and B.

5. The programmable logic device of claim 1, further comprising a plurality of the first and second logic slices and a plurality of multiplexers, wherein the multiplexers are adapted to receive output signals from the first and second logic slices to implement at least one of a deeper and a wider memory.

6. The programmable logic device of claim 1, wherein the first and second logic slices are adapted to provide a dual port memory having ports A and B, with the first clock signal providing a write clock signal for ports A and B, and the second clock signal providing a read clock signal.

7. The programmable logic device of claim 1, wherein the second register is coupled to the first read port clock multiplexer, which is adapted to receive the first and second clock signals, and wherein the third register is coupled to the second read port clock multiplexer, which is adapted to receive the first and second clock signals.

8. A programmable logic device comprising:
    a plurality of first logic slices adapted to receive a first and a second clock signal, wherein the first logic slice comprises:
        a plurality of first lookup tables adapted to provide logic or memory functions;
        a plurality of first registers coupled to corresponding ones of the first lookup tables; and
        means for selectively providing the first and second clock signals to at least one of the first registers; and
    a plurality of second logic slices adapted to receive the first and second clock signals, wherein the second logic slice comprises:
        a plurality of second lookup tables adapted to provide logic or memory functions;
        a plurality of second registers coupled to corresponding ones of the second lookup tables; and
        means for selectively providing the first and second clock signals to at least one of the second registers.

9. The programmable logic device of claim 8, further comprising means for providing write control to the plurality of first and second lookup tables.

10. The programmable logic device of claim 8, wherein a pair of the first and second logic slices are adapted to provide a synchronous dual port memory.

11. The programmable logic device of claim 8, further comprising a plurality of multiplexers, wherein the multiplexers are adapted to receive output signals from the first and second logic slices to implement at least one of a deeper and a wider memory.

12. The programmable logic device of claim 8, wherein the first and second logic slices are adapted to selectively function as logic, as a single port memory, or as a synchronous dual port memory.

13. The programmable logic device of claim 8, wherein the first and second logic slices are adapted to be combined to provide a dual port memory having ports A and B, with the first clock signal providing a write clock signal for ports A and B and a read clock signal for port A, and the second clock signal providing a read clock signal for port B.

14. The programmable logic device of claim 13, wherein the first logic slice provides a bit zero for ports A and B, while the second logic slice provides a bit one for ports A and B.

15. A method of providing synchronous memory within a programmable logic device, the method comprising:
    providing a first and a second clock signal for a first and a second logic slice;
    utilizing the first clock signal as a write clock signal for ports A and B of the first logic slice; and
    utilizing the second clock signal as a read clock signal for port B of the second logic slice, with the first clock signal providing a read clock signal for port A.

16. The method of claim 15, further comprising utilizing the second clock signal as the read clock signal for port B of the first logic slice.

17. The method of claim 15, wherein the first and second logic slices are adapted to selectively function as a single port memory, a dual port memory, or as logic.

18. The method of claim 15, further comprising combining selectively output signals from the first and second logic slices to provide at least one of a wider and a deeper memory.

19. The method of claim 15, further comprising utilizing the first and second logic slices as dual port memory having ports A and B, with the first logic slice providing a bit zero for the ports A and B, while the second logic slice provides a bit one for the ports A and B.

20. The method of claim 15, further comprising providing selectively the first and second clock signals to registers within the first and second logic slices.

* * * * *